United States Patent [19]
Lassorie

[11] Patent Number: 5,515,382
[45] Date of Patent: May 7, 1996

[54] PROCESS FOR TESTING THE OPERATION OF AN APPLICATION SPECIFIC INTEGRATED CIRCUIT AND APPLICATION SPECIFIC INTEGRATED CIRCUIT RELATING THERETO

[75] Inventor: Jean-Louis Lassorie, Saint-Egreve, France

[73] Assignee: SGS-Thomson Microelectronics S.A., Pouilly, France

[21] Appl. No.: 87,925

[22] Filed: Jul. 6, 1993

[30] Foreign Application Priority Data

Jul. 8, 1992 [FR] France ................................. 92 08453

[51] Int. Cl.⁶ .................................................. G01R 19/00
[52] U.S. Cl. ........................ 371/22.3; 371/22.1; 371/25.1
[58] Field of Search .................................. 371/22.1, 22.3, 371/19, 25.1; 326/47, 61, 63, 101; 327/373, 564, 565; 364/490, 491

[56] References Cited

U.S. PATENT DOCUMENTS

| | | | |
|---|---|---|---|
| 4,947,357 | 8/1990 | Stewart et al. | 371/22.3 |
| 5,003,204 | 3/1991 | Cushing et al. | 371/22.3 |
| 5,115,435 | 5/1992 | Langford, II et al. | 371/22.1 |
| 5,130,988 | 7/1992 | Wilcox et al. | 371/22.3 |
| 5,132,974 | 7/1992 | Rosales | 371/22.1 |
| 5,173,904 | 12/1992 | Daniels et al. | 371/22.3 |
| 5,239,642 | 8/1993 | Gutierrez et al. | 371/19 |
| 5,301,156 | 4/1994 | Talley | 371/22.3 |
| 5,379,308 | 1/1995 | Nhuyen et al. | 371/22.1 |
| 5,392,297 | 2/1995 | Bell et al. | 371/22.3 |
| 5,428,623 | 6/1995 | Rachman et al. | 371/22.3 |

OTHER PUBLICATIONS

Proceedings of the International Test Conference, Aug. 29–31, 1989, pp. 615–623, IEEE, New York, U.S., W. Harwood et al., "Testability Features of the MC68332 Modular Microcontroller".

IEEE Transactions on Industrial Electronics and Control Instrumentation, vol. 36, No. 2, May 1989, New York, U.S., pp. 231–240, J.-C. Lien et al., "A Universal Test and Maintenance Controller for Modules and Boards".

Proceedings of the Custom Integrated Circuits Conference, May 15–18, 1989, pp. 11.2.1–11.3.5, IEEE, New York, U.S., K. W. Lang et al., "A 16 Mbps Adapter Chip for the IBM Token-Ring Local Area Network".

Primary Examiner—Emanuel T. Voeltz
Assistant Examiner—Hal D. Wachsman
Attorney, Agent, or Firm—David M. Driscoll; James H. Morris; Richard F. Giunta

[57] ABSTRACT

An application specific integrated circuit that comprises a central processing unit and a plurality of devices which are dependent on the application of the integrated circuit and are connected to the central processing unit. At least one shift register is provided by connecting in series elementary cells each mounted on a respective line corresponding to an input/output line of the central processing unit, each cell being able to inject into its respective line a value entered serially through the shift register, and further being able to sample the value of the binary signal carried by its respective line with a view to a reading of this value through the shift register. A method is provided for using the shift register to test the makeup of the application specific integrated circuit, or an application program executing on the central processing unit.

40 Claims, 2 Drawing Sheets

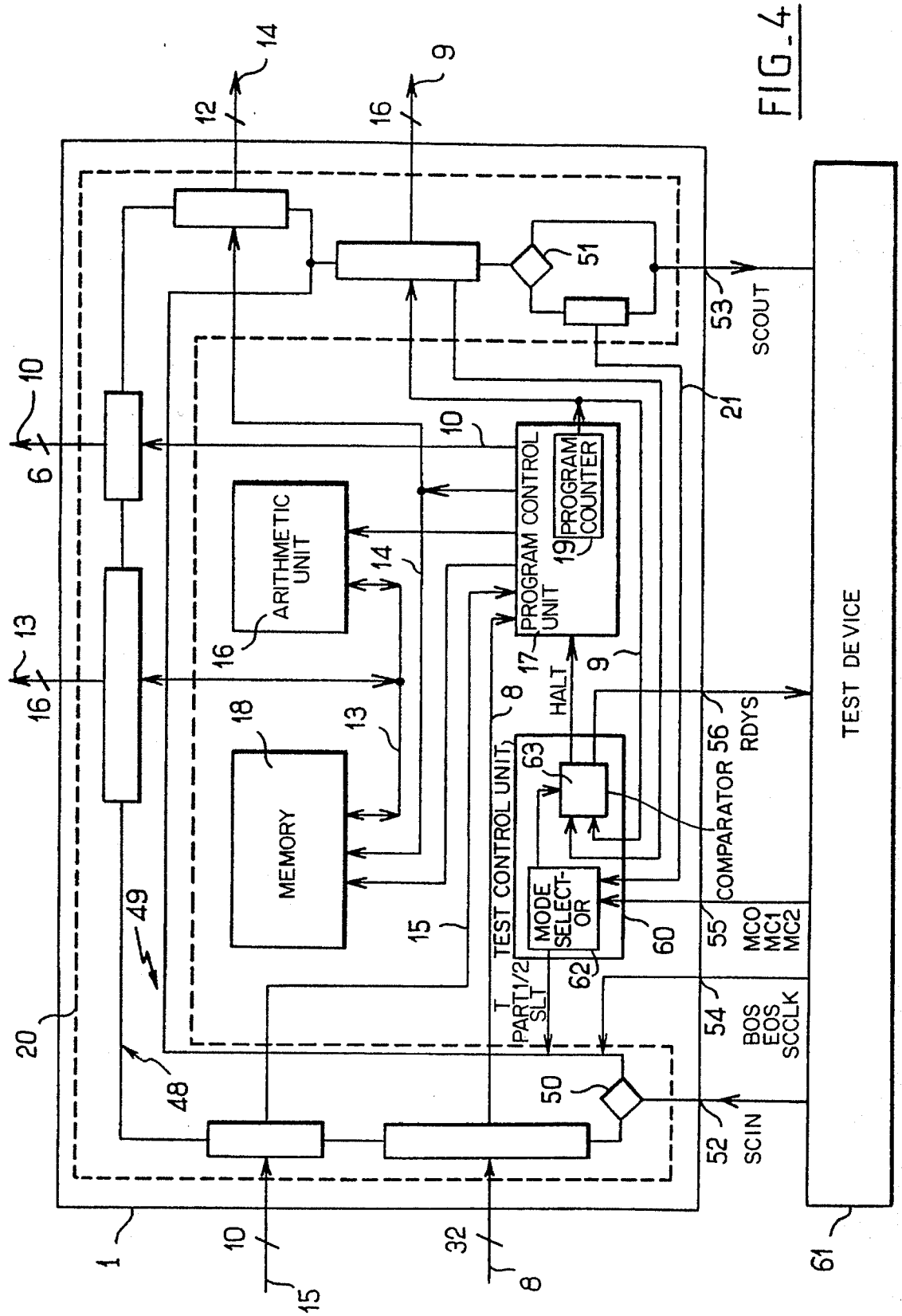
FIG_4

PROCESS FOR TESTING THE OPERATION OF AN APPLICATION SPECIFIC INTEGRATED CIRCUIT AND APPLICATION SPECIFIC INTEGRATED CIRCUIT RELATING THERETO

BACKGROUND OF THE INVENTION

1. Field of the Invention

The present invention relates to a process for testing the operation an application specific integrated circuit, as well as an application specific integrated circuit designed for implementing this process.

2. Discussion of the Related Art

Application specific integrated circuits, or ASIC (for "Application Specific Integrated Circuit") are integrated circuits made on a single chip as requested by the user.

Certain application specific integrated circuits comprise a central processing unit (for example a signal processor, or DSP, in the case of an integrated circuit dedicated to signal processing) associated with a certain number of devices which depend on the application of the circuit: memories, interfaces etc.

The user supplies the manufacturer with the application program for the circuit and information on the desired circuit configuration such as the type and volume of work memories or the nature of the circuit interface devices. The integrated circuit is then made on a chip by associating with the central processing unit, the specified devices, in particular a read-only memory (ROM) containing the application program.

Once the silicon chip forming the application specific circuit has been manufactured, various tests must be applied thereto in order to verify its correct operation. Customarily, the manufacturer of the circuit tests the makeup of the circuit (characteristics of the components, connections etc.) and the user tests his application program or the way in which the circuit executes it.

For the manufacturer's test, it is known to execute, via the central processing unit, an automatic test program stored in the program memory of the circuit. The makeup of the central processing unit can thus be tested. The makeup of certain devices associated with the central processing unit can likewise be thus tested, through a knowledge of their characteristics: type, volume, format, waveform of the signals etc. Now, in the case of an application specific integrated circuit, these characteristics are known only after receipt of the request from the user. The number of possible configurations of the circuit being very high, it is not possible to provide for an automatic test program for each configuration requested. On the contrary, it is desired that a program be able to test circuits having various configurations.

In order to test integrated circuits, it is also known, for example from EP-A-0 358 376, to use a shift register formed by connecting in series a set of elementary cells mounted on the input/output lines of the integrated circuit. Each cell can inject onto its respective line a value entered serially through the shift register, and sample the value of the signal carried by this line with a view to a serial reading through the shift register. It is thus possible to inject test signals into the integrated circuit and to check the behavior of the circuit in response to these signals. As the elementary cells are mounted at the level of the external gateways of the integrated circuit, they do not give access directly to the internal buses of the circuit serving in the communications between the central processing unit and the application-dependent devices in the case of an application specific integrated circuit. This method does not therefore allow separate testing of the central processing unit and of the application-dependent devices, without considerably increasing the number of elementary cells of the shift register, to the detriment of the compactness of the integrated circuit and of the speed of the shift register. The serial entry and reading of the data through the shift register are slow operations so that it is not possible in practice systematically to test correct operation of the devices associated with the central processing unit, in particular memories which may typically contain several hundreds of thousands of bits.

In view of the foregoing, a purpose of the present invention is to propose a process for testing the operation of an integrated circuit which is well suited to the case of application specific integrated circuits and which in particular allows the manufacturer to test both the makeup of the central processing unit and that of the application-dependent devices.

Another purpose of the invention is that the process offers facilities for testing the application program of the application specific integrated circuit.

The invention thus proposes a process for testing the operation of an application specific integrated circuit comprising a central processing unit and devices which are dependent on the application of the integrated circuit and are connected to the central processing unit, in which at least one shift register is formed by connecting in series a set of elementary cells each mounted on a respective line carrying a binary signal of the integrated circuit, each cell being able to inject onto the said line a value entered serially through the shift register and being able to sample the value of the binary signal carried by the said line with a view to a reading of this value through the shift register wherein the elementary cells of the shift register are mounted on lines corresponding to gateways of the central processing unit.

It is thus possible, by virtue of a shift register which keeps a relatively simple structure and simple organization, to test both the central processing unit and the associated devices. The register can achieve this with a restricted number of elementary cells, some of them being mounted on the internal buses of the circuit connecting the central processing unit to the associated devices.

It will be noted that the making of application specific integrated circuits derives substantial advantages from the implementation of the process according to the invention. Indeed, in order to rationalize their design and manufacture, it is customarily desirable for the circuits to be designed by assembling somewhat standardized units: central processing unit, memory unit(s), interface unit(s), etc, it being possible for the user to choose these units from "libraries" offered by the manufacturer. The classical mounting of a shift register at the level of the external terminals of the overall integrated circuit does not allow standardization of the structure of this register, which will always depend on the particular configuration of the circuit. Through the invention, this register can be included within a standardized central processing unit usable with a large number of configurations of associated devices. A step of design and optimization of surface area of the shift register, with each request for an application specific integrated circuit, is therefore avoided.

A preferred version of the process according to the invention includes a procedure for automatic testing of the makeup of the integrated circuit comprising the following steps:

entry through the shift register of characteristic data of the devices which are dependent on the application and are connected to the central processing unit and storage of these characteristic data;

execution by the central processing unit of a test program stored in a program memory of the integrated circuit, this test program including at least one instruction for reading the said characteristic data and one instruction for storing test results; and reading of the test results stored through the shift register.

The makeup of the circuit can then be tested in a fast way by executing a test program which receives certain configuration parameters via the shift register, the results of this program being also read by the shift register. The execution proper of the test program is not delayed by serial data exchanges through the shift register, so that the procedure makes it possible to test both the logic of the circuit and the speed of execution of the instructions.

Preferably, the process according to the invention includes a procedure for testing an application program stored in a program memory of the integrated circuit, this procedure comprising the following steps:

entry through the shift register of a verification address, and storage of this verification address;

execution of the application program as far as the instruction stored in the said verification address in the program memory; and reading through the shift register of values present on the access lines of the central processing unit.

The user of the integrated circuit can thus test his application program and conveniently detect possible improvements to be made thereto ( emulation mode ).

The verification address is advantageously stored in elementary cells of the shift register which are mounted on lines of an instruction address bus of the central processing unit, provided in order to tag the locations of the program memory containing the instructions of the application program.

This avoids provision for a memory zone serving uniquely in the storage of the verification address.

A second aspect of the invention concerns an application specific integrated circuit, comprising a central processing unit, and devices which are dependent on the application of the integrated circuit and are connected to the central processing unit, and at least one shift register including a set of elementary cells connected in series and each mounted on a respective line carrying a binary signal of the integrated circuit, each cell being able to inject onto the said line a value entered serially through the shift register and being able to sample the value of the binary signal carried by the said line with a view to a reading of this value through the shift register wherein the elementary cells of the shift register are mounted on lines corresponding to gateways of the central processing unit.

This circuit is designed to implement the above process.

Other features and advantages of the invention will emerge in the description below of a preferred, non-limiting illustrative embodiment, read conjointly with the attached drawings, in which:

BRIEF DESCRIPTION OF THE DRAWINGS

FIG. 4 is a diagram of a central processing unit of the circuit of FIG. 1.

DETAILED DESCRIPTION

Figure 1:
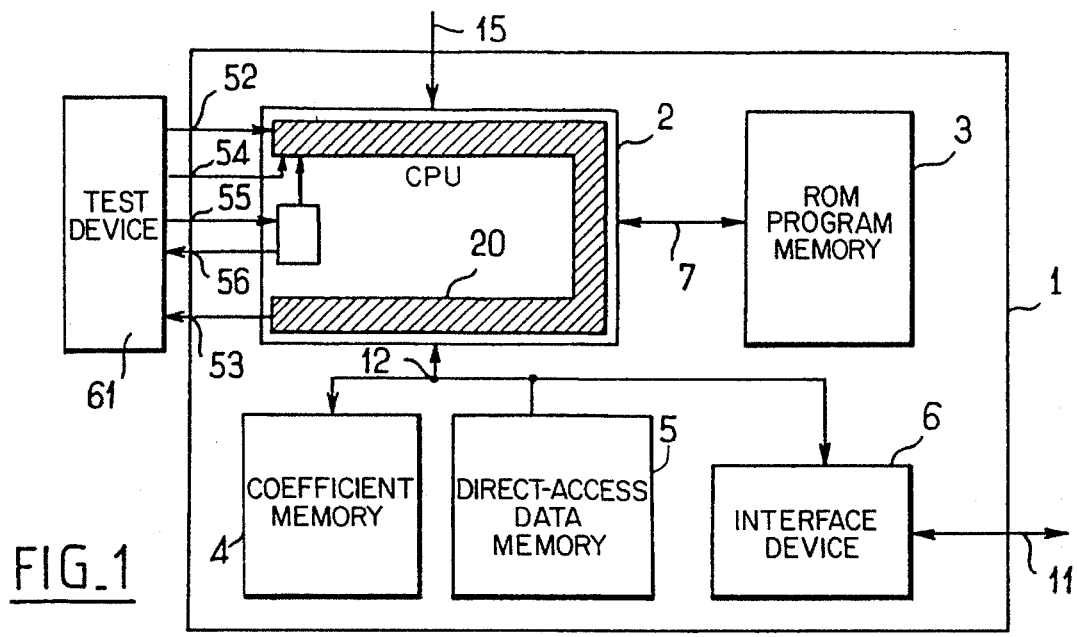
FIG. 1 is a diagram of an application specific integrated circuit according to the invention.

With reference to FIG. 1, an integrated circuit 1 according to the invention, made on a single silicon chip, includes a central processing unit 2 and a certain number of devices 3, 4, 5, 6 which are dependent on the application of the integrated circuit. In the example described, the integrated circuit 1 is dedicated to signal processing, and the central processing unit 2 includes the essential elements of a signal processor (DSP). The devices associated with the central processing unit 2 comprise a read-only (ROM) program memory 3, a read-only (ROM) coefficient memory 4, a direct-access (RAM) data memory 5 and one or more interface devices schematized by the unit 6 in FIG. 1. These interface devices are connected to primary gateways 11 of the circuit 1 allowing the exchange of analog or digital signals with the environment of the circuit 1.

The connections 7 between the central processing unit and the program memory 3 comprise, in a conventional manner, a 32-bit instruction bus 8, a 16-bit instruction address bus 9 and lines of a 6-bit command output bus 10 (FIG. 4) enabling the central processing unit 2 to read program instruction from the memory 3 with a view to their execution.

Similarly, the connections 12 between the central processing unit 2 and the devices 4, 5, 6 comprise a 16-bit bidirectional data bus 13, a 12-bit data address bus 14 and lines of the 6-bit command output bus 10 (FIG. 4) enabling the central processing unit 2 to exchange data (send or receive) with the devices 4, 5, 6.

The central processing unit 2 furthermore includes a 10-bit command input bus 15 enabling it to receive external control signals.

As represented schematically in FIG. 4, the central processing unit 2 of the application specific integrated circuit 1 includes, in a conventional manner, an arithmetic unit 16, a program control unit 17 and a few direct-access memory registers (RAM) 18. The program control unit 17 conventionally comprises a sequencer (not shown), decoders (not shown) receiving the instructions carried on the instruction bus 8 and the commands received by the central processing unit 2 on the command input bus 15 in order appropriately to control the arithmetic unit 16, an address generator (not shown) connected to the data address bus 14 in order to produce addresses tagging the data locations in the memory 18 or the associated devices 4, 5, 6, a command generator (not shown) connected to the command output bus 10 and to the memory 18 in order to control data exchanges with the associated devices 4, 5, 6 or with the memory 18, and a program counter 19 connected to the instruction address bus 9 in order to produce addresses tagging program instructions in the program memory 3.

According to the invention, the central processing unit 2 is equipped with a shift register 20 whose structure and operation are elucidated below. This shift register 20, of the "boundary scan" type ( see EP-A-0 358 376), comprises a set of elementary cells connected in series and each mounted on a respective line carrying a binary signal of the integrated circuit 1. More precisely, the elementary cells of the shift register are mounted on lines corresponding to gateways of the central processing unit 2: instruction bus 8, command input bus 15, data bus 13, command output bus 10, data address bus 14, instruction address bus 9, and input lines 21 for three selection signals (FIG. 4).

Figure 2:
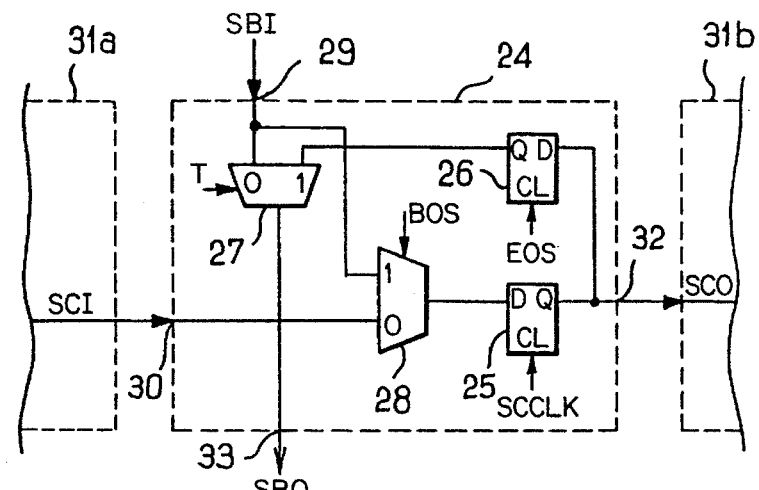
FIGS. 2 and 3 are diagrams of elementary cells of a shift register of the circuit of FIG. 1.

Elementary cells 24 of the type represented in FIG. 2 are used for the monodirectional access lines of the central processing unit 2. Such a monodirectional cell comprises a D-type delay flip-flop 25, a latching circuit 26, a first two-input multiplexer 27 and a second two-input multiplexer 28. A parallel input 29 of the cell 24 receives the binary signal SBI carried by the line on which the cell 24 is mounted. This input 29 is connected to an input of the first multiplexer 27 and to an input of the second multiplexer 28. A serial input 30 of the cell 24 receives a binary signal SCI coming from the previous cell 31a of the shift register 20. This input 30 is connected to the other input of the second multiplexer 28. The output of the second multiplexer 28 is connected to the input D of the delay flip-flop 25. The output Q of the delay flip-flop 25 produces a binary signal SCO which is addressed to the next cell 31b of the shift register by a serial output 32 of the cell. The output Q of the flip-flop 25 is furthermore connected to the input D of the latching circuit 26 whose output Q is connected to the other input of the first multiplexer 27. The output of the first multiplexer 27 is connected to a parallel output 33 of the cell 24 which transmits a binary signal SBO over the line containing the cell 24.

The monodirectional cell 24 receives four control signals T, BOS, SCCLK, EOS. The value of the binary signal T controls the first multiplexer 27: T=0 corresponds to the transmission over the line of the signal SBI (transparent cell: SBO=SBI), whilst T=1 corresponds to the transmission over the line of the signal stored in the latching circuit 26. The value of the binary signal BOS controls the second multiplexer 28: BOS=0 causes the input D of the delay flip-flop 25 to communicate with the serial input 30 of the cell, whilst BOS=1 causes the input D of the delay flip-flop 25 to communicate with the parallel input 29 of the cell. The binary signal SCCLK is used to clock the delay flip-flop 25. The binary signal EOS serves to latch, in the latching circuit 26, the value present at the output Q of the D flip-flop (latching on the falling edges of EOS for example).

When a monodirectional cell 24 is mounted on an input line of the central processing unit 2 (buses 8 or 15), its parallel input 29 is joined to the part of this line directed towards the outside of the central processing unit 2, and its parallel output 33 is joined to the part of this line directed towards the inside of the central processing unit 2. Conversely, when a monodirectional cell 24 is mounted on an output line of the central processing unit 2 (buses 10, 14 or 9), its parallel input 29 is joined to the part of this line directed towards the inside of the central processing unit 2, and its parallel output 33 is joined to the part of this line directed towards the outside of the central processing unit 2. The selection signal input lines 21 being directed only towards the inside of the central processing unit 2, the corresponding monodirectional cells 24 have only their parallel output joined to these lines.

Figure 3:
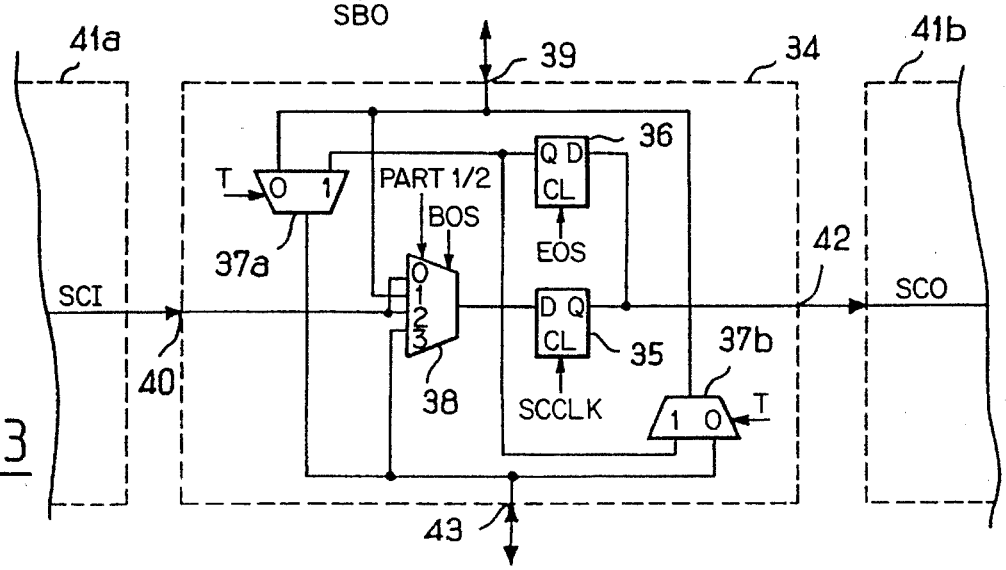

For the bidirectional access lines of the central processing unit 2, which in the example represented are those of the data bus 13, use is made of elementary cells 34 of the type represented in FIG. 3. Such a bidirectional cell comprises a D-type delay flip-flop 35 clocked by the clock signal SCCLK, a latching circuit 36 controlled by the signal EOS, a first two-input multiplexer 37a controlled by the signal T, a second two-input multiplexer 37b controlled by the signal T, and a third four-input multiplexer 38 controlled by the signal BOS and by another binary signal PART1/2. A parallel input/output 39 of the cell 34 connected to the line of the data bus is connected to an input of the first multiplexer 37a. Symmetrically, a parallel input/output 43 of the cell 34 connected to the line of the data bus is connected to an input of the second multiplexer 37b. The other two inputs of the first and second multiplexers 37a, 37b are connected to the output Q of the latching circuit 36. The output of the first multiplexer 37a is connected to the parallel input/output 43 of the cell 34. The output of the second multiplexer 37b is connected to the parallel input/output 39 of the cell 34. The third multiplexer 38 has its output connected to the input D of the delay flip-flop 35. The output Q of the delay flip-flop 35, which produces the signal SCO delivered to the next cell 41b of the shift register 20 via a serial output 42 of the cell, is furthermore connected to the input D of the latching circuit 36. The third multiplexer 38 has two inputs connected to a serial input 40 of the cell 34 receiving the binary signal SCI coming from the previous cell 41a of the shift register 20, an input connected to the parallel input/output 39 of the cell 34, and an input connected to the parallel input/output 43 of the cell 34. When BOS=0, the multiplexer 38 causes the input D of the delay flip-flop 35 to communicate with the serial input 40 of the cell. When BOS=1, the multiplexer 38 causes the input D of the flip-flop 35 to communicate with the parallel input/output 39 if PART1/2=0 or with the parallel input/output 43 if PART1/2=1.

The organization of the elementary cells in the shift register 20 is illustrated in FIG. 4. The register 20 includes at least two data shift paths 48, 49. A first path 48 is formed between elementary cells of a group of cells comprising, in this order, the elementary cells mounted on the lines of the instruction bus 8, of the command input bus 15, of the data bus 13, of the command output bus 10, of the data address bus 14 and of the instruction address bus 9 (32+10+16+6+12+16=92 cells). A second path 49 is formed between elementary cells of a group of cells including in this order the elementary cells mounted on the lines of the instruction address bus 9 and the selection signal input lines 21 (16+3=19 cells).

In order to select the data shift path used, the shift register 20 can include two switches 50, 51 with two positions. In a first position (use of the path 48), the first switch 50 causes the data input 52 of the register 20 to communicate with the serial input 30 of the first elementary cell of the instruction bus 8, and the second switch 51 causes the serial output 32 of the last elementary cell of the instruction address bus 9 to communicate directly with the data output 53 of the register 20. In a second position, (use of the path 49), the first switch 50 causes the data input 52 of the register 20 to communicate with the serial input 30 of the first elementary cell of the instruction address bus 9, and the second switch 51 causes the serial output 32 of the last elementary cell of the instruction address bus to communicate with the serial input 30 of the first elementary cell mounted on the selection signal input lines 21. The position of the switches 50, 51 is controlled by a path selection signal SLT coming from a test control unit 60.

In order to test the integrated circuit 1, it is connected to a test device 61 (FIGS. 1 and 4). In order to make this link, the circuit 1 includes the following terminals:

terminal 52 which corresponds to the serial data input of the shift register 20;

terminal 53 which corresponds to the serial data output of the shift register 20;

terminals designated collectively by the reference 54 for addressing to the set of elementary cells of the shift register 20 their control signals BOS, EOS and SCCLK;

terminals designated collectively by reference 55 for addressing to the test control unit 60 three binary selection signals MC0, MC1 and MC2; and output terminal 56 through which the nest control unit 60 can address a detection signal RDYS to the test device 61.

The test control unit 60 includes a mode selector 62 which receives three selection signals MC0, MC1, MC2 received at the terminals 55 and the three selection signals BP0, BP1, STE present in the elementary cells mounted on the lines 21, and which establishes, as a function of these six selection signals, the path selection signal SLT, the control signal PART1/2 intended for the bidirectional cells 34 mounted on the data bus 13, and the control signals T intended for the various elementary cells of the shift register 20. For example, the mode selector 62 can produce the signals indicated in Table I as a function of the selection signals MC0, MC1, MC2, BP0, BP1, STE. In the Table I, the symbol "X" indicates that the value of the corresponding bit is immaterial, the value SLT=0 corresponds to the selection of the first data shift path 48, and the value SLT=1 corresponds to the selection of the second data shift path 49, the bit TID corresponds to the control signal T for the cells mounted on the lines of the instruction bus 8, the bit TCI corresponds to the control signal T for the cells mounted on the lines of the command input bus 15, the bit TDR corresponds to the control signal T for the cells mounted on the lines of the data bus 13, the bit TCA corresponds to the control signal T for the cells mounted on the lines of the command output 10 or of the data address bus 14, and the bit TIA corresponds to the control signal T for the cells mounted on the lines of the instruction address bus 9. The control signal T for the three cells mounted on the selection signal input lines 21 can be taken permanently equal to 1 since these cells cannot be transparent.

addressed to the sequencer of the program control unit 17 in order to interrupt the program counter 19. Transmission of the interrupt signal HALT can furthermore be controlled by a signal supplied to the comparator 63 by the mode selector 62.

The first four modes indicated in Table I correspond to conventional modes of operation of a register of "boundary scan" type:

a) In the two sampling modes, selected for the indicated values of the bits MC0, MC1, MC2, the elementary cells of the first path 48 sample the values of the binary signals carried by their respective lines, then these values are read serially through the shift register 20. The sampling is performed by setting the bit BOS to the 1 level and by producing a clock cycle SCCLK, which stores the sampled value in the flip-flop 25, 35 (FIGS. 2 and 3). Next, reading is performed by setting the bit BOS to the 0 level and by producing clock cycles SCCLK, which progressively shifts the stored values along the path 48, so that the data SCOUT arrive serially at the data output 53 of the shift register 20 and can be read by the test device 61. 50 (=16+12+6+16) clock cycles SCCLK are thus required to read all the values coming from the central processing unit 2 in the mode for sampling the central processing unit (PART1/2=0), whilst 92 clock cycles SCCLK are required to read all the values received by the central processing unit 2 in the mode for sampling the associated devices (PART1/2=1). These two sampling modes do not interfere with the operation of the circuit 1 (interrupt signal HALT deactivated).

b) In the two check modes, selected by their indicated values of the bits MC0, MC1, MC2, the elementary cells of the first path 48 are used to enter values serially through the shift register 20, then to inject these values

TABLE I

| MODE | MC0 | MC1 | MC2 | BP0 | BP1 | STE | TID | TCI | TDR | TCA | TIA | PART ½ | SLT |
|---|---|---|---|---|---|---|---|---|---|---|---|---|---|
| Sampling of the central processing unit | 0 | 0 | 0 | X | X | X | 0 | 0 | 0 | 0 | 0 | 0 | 0 |
| Sampling of the associated devices | 1 | 0 | 0 | X | X | X | 0 | 0 | 0 | 0 | 0 | 1 | 0 |
| Checking of the central processing unit | 0 | 1 | 0 | X | X | X | 1 | 1 | 1 | 1 | 0 | 0 | 0 |
| Checking of the associated devices | 1 | 1 | 0 | X | X | X | 1 | 1 | 1 | 1 | 0 | 1 | 0 |
| Fixing of a verification address | 0 | 1 | 1 | X | X | X | 0 | 0 | 0 | 0 | 0 | 0 | 1 |
| Sampling at the verification address | 1 | 1 | 1 | 1 | 0 | 0 | 0 | 0 | 0 | 0 | 0 | f (WR) | 0 |
| Instantaneous | 1 | 1 | 1 | 1 | 1 | 0 | 0 | 0 | 0 | 0 | 0 | f (WR) | 0 |
| Stepped | 1 | 1 | 1 | 0 | 1 | 0 | 0 | 0 | 0 | 0 | 0 | f (WR) | 0 |
| Automatic test | 1 | 1 | 1 | 0 | 0 | 1 | 0 | 1 | 0 | 0 | 0 | 0 | 0 |

The test control unit 60 furthermore comprises a comparator 63 having two 16-bit inputs receiving respectively the instruction address generated by the program counter 19 and the number of 16 bits corresponding to the 16 bits stored in the latching circuits 26 of the elementary cells mounted on the lines of the instruction address bus 9 (for this purpose, the output Q of each of these 16 latching circuits is furthermore connected to the corresponding input of the comparator 63). The comparator 63 activates the detection signal RDYS addressed to the test device 61 via the terminal 56 when it detects equality between its two 16-bit inputs. After activating the detection signal PAYS, the comparator 63 furthermore activates an interrupt signal HALT which is onto their respective lines. The response of the circuit to the injecting of these values can next be sampled and read as in the sampling modes. Entry is performed by setting the bit BOS to the 0 level, by producing clock cycles SCCLK, and by presenting the values SCIN serially at the SCCLK clock rate on the data input 52 of the shift register 20. Once the values have reached the flip-flops 25, 35 of the appropriate cells, a pulse of the signal EOS latches these data in the latching circuits 26, 36. The injecting of the values then results from the passing to the 1 level of the control signals T indicated in Table 1, which control the multiplexers 27, 37a or 37b in order to cause the output Q of the latching circuits 26, 36 to communicate with the respective lines. In the check mode of the central processing unit, it is thus possible to inject instructions to be executed onto the instruction bus 8 and data useful in the execution of these instructions onto the data bus 13:58 (=16+10+32) SCCLK clock cycles are useful. The response of the central processing unit 2 to the instructions injected is then sampled and read as in the sampling mode of the central processing unit, towards the inside central processing unit 2 as regards the data bus 13 (PART1/2=0). The reading step can be performed at the same time as the serial entry of other values via the data input 52. The mode for checking the associated devices differs from the mode for checking the central processing unit in that the responses of the circuit are sampled towards the outside of the central processing unit 2 for the bidirectional cells mounted on the data bus 13 (PART1/2=1). This mode for checking the associated devices serves, when the check instructions injected onto the instruction bus 8 are instructions for reading from the devices associated with the central processing unit, a 12-bit address having simultaneously to be injected onto the data address bus 14:76 (=12+6+16+10+32) SCCLK clock cycles are required. In these two check modes, the program counter 19 is interrupted (interrupt signal HALT activated by the mode selector 62).

The process according to the invention includes a procedure for testing the program for application of the circuit stored in the program memory 3. The application program having been written by the manufacturer of the integrated circuit 1 into the memory 3, the circuit 1 can be delivered to the user with a test device, or emulation tool, 61 appropriate for performing the procedure for testing the application program.

This procedure comprises an initial step of entering through the shift register 20 a verification address and of storing this verification address. This initial step is performed in the mode for fixing a verification address (Table I) when MC0=0, MC1= MC2= 1, which selects the second path 49 of the shift register 20 and interrupts the program counter 19 (activation of the interrupt signal HALT, forced by the mode selector 62). The verification address is entered at the same time as the values of the three selection bits BP0, BP1, STE by setting the bit BOS to the 0 level, by producing 19 SCCLK clock cycles, and by synchronously presenting on the data input 52 of the register 20 the values corresponding to the three bits BP0, BP1, STE and to the verification address (16 bits). These values are then stored in the latching circuits 26 of the cells of the second path 49 by producing a pulse of the signal EOS. Execution of the application program is interrupted during this step owing to the interrupting of the program counter 19.

Once the verification address has been entered and stored, application of the selection signals MC0= MC1=MC2=1 allows activation of the operating mode defined by the values of the bits BP0, BP1, STE (Table I) which correspond to signals for selecting modes of execution of the procedure for testing the application program.

The procedure for testing the application program then comprises an execution of the application program as far as the instruction stored at the verification address in the program memory 3, then a step of reading, through the shift register 20, values present on access lines of the central processing unit 2. These two steps can be performed either in sampling at the verification address mode, or in instantaneous mode (Table I). When the selection signals MC0, MC1, MC2 take the value 1, the mode selector 62 deactivates the interrupt signal HALT, so that incrementation of the program counter 19 resumes and the instructions of the application program are executed successively. When the program counter 19 reaches the verification address, the comparator 63 activates the detection signal RDYS addressed to the test device 61, this triggering the reading step. This reading step is performed as in one of the two conventional modes for sampling the shift register 20: the data are first sampled by setting the signal BOS to the 1 level and by producing a SCCLK clock cycle, then they are read serially by setting the signal BOS to the 0 level and by producing 92 SCCLK clock cycles, this allowing recovery of the data on the output SCOUT of the shift register 20.

In Table I, the notation f(WR) signifies that in sampling the verification address mode or in instantaneous mode (or in stepped mode which will be described further on), the sampling of the values carried by the data bus 13, and defined by the bit PART1/2, is controlled by the value of the write control signal WR resulting from the decoding by the program control unit 17 of the instruction in progress and delivered on the command output bus 10. This allows observation of the datum originating from the central processing unit 2 (PART1/2=0) when an instruction for writing to one of the associated devices 4, 5, 6 is executed, and observation of the datum originating from one of the associated devices 4, 5, 6 (PART1/2=1) when an instruction for reading from this device is executed.

In instantaneous mode, the reading step is performed without interrupting execution of the application program: the mode selector 62 prevents the transmission of the interrupt signal HALT to the control unit 17.

In sampling at the verification address mode, the reading step is accompanied by an interruption of the execution of the application program: the mode selector 62 enables transmission of the interrupt signal HALT to the program control unit 17 after activation of the detection signal RDYS. The signal HALT is activated with a delay of one clock period of the central processing unit 2 in order to allow the central processing unit 2 no complete the instruction in progress before the interrupt. Execution of the application program remaining interrupted, it is then possible to read the contents of the internal registers of the central processing unit or of the locations of the memories 4, 5, by placing the shift register 20 in the mode for checking the central processing unit or in the mode for checking the associated devices. This enables the user to verify, as he desires, the response of the integrated circuit 1 to she application program.

This procedure for testing the application program, or emulation, enables the user of the application specific integrated circuit to detect possible programming errors or parts of the program capable of being optimized. The data resulting from the execution of the program and read through the register 20 can be compared with reference data which the user knows through earlier simulations. When an error has been detected for one of the instructions of the application program, the invention enables the user to continue testing his program despite the existence of this error: he fixes a verification address corresponding to the address of the erroneous instruction, he follows the procedure for testing the application program in sampling at the verification address mode (with interrupt), he sets the register 20 into the mode for checking the central processing unit or into the mode for checking the associated devices by entering an instruction appropriate for correcting the effects produced by the erroneous instruction, and he resumes the procedure for testing the application program after having possibly defined a new verification address.

The user therefore has a great functional wealth for verifying correct operation of his application program. After having thus tested a specimen of the application specific integrated circuit, he can make a new request to the manufacturer with a modified application program.

The invention also enables the user to test his application program in stepped mode (Table I). In this mode, the values of the binary signals carried on the access lines of the central processing unit 2 are sampled and read after each instruction of the application program. The mode selector 62 then controls the comparator 63 so that it activates the detection signal RDYS and the interrupt signal HALT after each change of the address delivered by the program counter 19 (the interrupt is required so as to have time to read the data serially through the shift register 20).

The process according to the invention furthermore includes a procedure for automatic testing of the makeup of the integrated circuit. This procedure will generally be applied by the manufacturer of the application specific integrated circuit 1 before delivering it to the user by means of an appropriate test device 61. This procedure does not include any verification of the user's application program. It comprises an execution by the central processing unit 2 of a stored test program starting from a predetermined address in the program memory 3. This test program is not peculiar to the configuration of the devices associated with the central processing unit, thus enabling this same program to be used in a whole family of application specific integrated circuits constructed around one type of central processing unit 2.

For this test program to be able to test the central processing unit 2 and also the associated application-dependent devices 3, 4, 5, 6, the procedure for testing the makeup of the circuit comprises an initial step of entering, through the shift register 20, characteristic data of the associated devices 3, 4, 5, 6 and of storing these characteristic data. The characteristic data typically comprise the number and nature of the associated devices, the waveform of their control signals, the length of the data words exchanged, the access times, the number of locations (volume) of the memories 3, 4, 5, the addresses of the first locations of the memories 3, 4, 5 etc.

This step of entering and storing characteristic data is performed by means of the shift register 20 in the mode for checking the central processing unit 2: the elementary cells of the register 20 are controlled in such a way as to inject onto the data bus 13 the characteristic data to be stored and to inject onto the instruction bus 8 a data write instruction present on she data bus 13 at a location of the internal memory 18 tagged by its address. The central processing unit 2 then executes this instruction supplied on the bus 8. This step can be repeated when the characteristic data include several 16-bit words.

Once the characteristic data have been stored, the test device 61 controls the mode selector 62 in order to select the automatic test mode (Table I). This selection is performed in two steps. First, selection signals MC0=0, MC1=MC2=1 are addressed in order to pass to the mode for fixing a verification address in order to be able to enter into the cells mounted on the lines 21, the values BP0=BP1=0, STE=1, allowing subsequent selection of the automatic test mode. Subsequently, the automatic test mode is enabled by producing the selection signals MC0=MC1=MC2=1, this deactivating the interrupt signal HALT, so that execution of the test program can commence. In automatic test mode, the control signal TCI is set to the 1 level in order to preclude external commands from being able to interfere with the execution of the test program. While the register 20 is in the mode for fixing a verification address (program counter 19 interrupted), a reinitialization signal addressed to the circuit 1 via the command input bus 15 is activated, thus enabling the control signal TCI=0. When the automatic test mode has become active (MC0=MC1=MC2=1), the test control unit 60 controls the program counter 19 in such a way that the reinitialization pulse places the program counter 19 at the address of the first instruction of the automatic test program in the memory 3 (in normal operation of the circuit 1 such a pulse for activating the reinitialization signal has the effect of reinitializing the program counter 19 at the address correspondingly, in the program memory 3, to the first instruction of the application program).

The test program includes initial instructions for reading characteristic data stored in the internal memory 18, thus supplying it with the parameters required to perform data exchange with the associated devices. It is particularly advantageous for the test program to include subsequently (read or write) instructions for exchanging data between the central processing unit 2 and the associated devices 3, 4, 5, 6. As the test program executes relatively fast, at the rate of the central processing unit 2, it is then possible to envisage testing the various locations of the associated memories 4, 5 one by one or testing, virtually in real time, data exchanges with the interface devices 6.

For execution of the test program to be fast, test results can be produced in the form of polynomial signatures calculated by a signature analyzer, not represented, mounted on an internal bus of the central processing unit. An example of such a signature analyzer is described in the work "LSI/VLSI Testability Design" by Frank F. Tsui, published by McGraw-Hill, 1988, Chapter 7.

The test program includes, finally, an instruction for storing these test results, which consists of an instruction for writing test results to a predetermined location of the internal memory 18.

After the step of executing the test program, the procedure for automatic testing of the makeup of the integrated circuit comprises a step of reading the test results stored through the shift register 20. This step of reading the results is performed by means of the register 20 in the mode for checking the central processing unit 2: the elementary cells of the register 20 are controlled in such a way as to inject onto the instruction bus 8 an instruction for reading test results at their location in the internal data memory 18 and for presenting these results on the data bus 13. The central processing unit 2 subsequently executes this instruction supplied on the bus 8. Then. the elementary cells of the register 20 are controlled so as to sample the 16-bit value present on the data bus 13 (PART1/2=0) and so as to read this value serially via the data output 53 of the register 20.

Once the results have been read by the test device 61, they can be compared with reference values which are known or acquired through simulation. This allows the detection of possible physical (hardware) faults in the application specific integrated circuit 1.

Although the invention has been described with reference to a preferred illustrative embodiment, it will be understood that this example is not limiting and that various modifications may be made thereto without departing from the scope of the invention.

What is claimed is:

1. A process for testing the operation of an application specific integrated circuit formed on a single silicon chip, the application specific integrated circuit including a standardized central processing unit and application-dependent devices which are dependent on the application of the integrated circuit, the standardized central processing unit having a plurality of input/output gateways that are coupled to the application-dependent devices for interfacing the standardized central processing unit with the application-dependent devices during operation of the application specific integrated circuit, the application specific integrated circuit further including at least one shift register formed by connecting in series a set of elementary cells each mounted on a respective line carrying a binary signal of the integrated circuit, each cell being able to inject onto its respective line a value entered serially through the shift register and being able to sample the value of the binary signal carried by its respective line with a view to a reading of this value of the binary signal through the at least one shift register, the process comprising the steps of:

A. mounting the elementary cells of the at least one shift register between the standardized central processing unit and the application-dependent devices on lines corresponding to the input/output gateways of the standardized central processing unit;

B. executing a test program on the standardized central processing unit in the application specific integrated circuit, the test program generating test results on at least some of the input/output gateways of the standardized central processing unit; and C. reading the test results through the at least one shift register.

2. The process as claimed in claim 1 wherein step B includes:

entering through the at least one shift register characteristic data of the devices which are dependent on the application and are connected to the standardized central processing unit;

storing the characteristic data; and executing in the standardized central processing unit a test program stored in a program memory of the application specific integrated circuit, the test program including at least one instruction for reading the characteristic data and one instruction for storing the test results.

3. The process as claimed in claim 2, wherein the step of executing the test program includes executing at least one instruction that exchanges data between the standardized central processing unit and the application-dependent devices.

4. The process as claimed in claim 2, wherein the characteristic data is stored in an internal memory of the standardized central processing unit.

5. The process as claimed in claim 2, wherein the at least one shift register comprises elementary cells respectively mounted on lines of a data bus and an instruction bus of the standardized central processing unit, and wherein the steps of entering and storing the characteristic data include the steps of:

controlling the elementary cells of the at least one shift register to inject, onto the data bus, the characteristic data and to inject onto the instruction bus an instruction for writing data present on the data bus at a location in a memory, and executing the instruction present on the instruction bus so that the characteristic data is written into the memory.

6. The process as claimed in claim 5, wherein step C includes:

controlling the elementary cells of the at least one shift register to inject onto the instruction bus an instruction for reading the test results and for presenting these test results on the data bus, executing the instruction present on the instruction data bus, and controlling the elementary cells of the at least one shift register to sample the value present on the data bus and to read the sampled value through the at least one shift register.

7. The process as claimed in claim 1 for testing an application program stored in a program memory of the application specific integrated circuit, wherein steps B and C include the following steps:

D. entering through the at least one shift register a verification address,

E. storing the verification address;

F. executing the application program as far as the instruction stored in the verification address in the program memory; and G. reading through the at least one shift register values present on at least some of the gateways of the standardized central processing unit.

8. The process as claimed in claim 7, wherein step F includes the step of interrupting the application program when it reaches the instruction stored at the verification address in the program memory.

9. The process as claimed in claim 7, wherein the step of storing the verification address includes the step of storing the verification address in elementary cells of the at least one shift register which are mounted on lines of an instruction address bus of the standardized central processing unit.

10. The process as claimed in claim 9, wherein the elementary cells mounted on the lines of the instruction address bus include an output connected to the input of a comparator having another input connected to a program counter of the standardized central processing unit, step F further including the comparator activating a detection signal when the address supplied by the program counter is equal to the verification address.

11. The process as claimed in claim 9, wherein step A includes forming at least two data shift paths for the at least one shift register, a first data shift path being formed between elementary cells of a first group comprising elementary cells mounted respectively on lines of a data bus, a data address bus, an instruction bus, the instruction address bus, a command input bus and a command output bus of the standardized central processing unit, a second data shift path being formed between elementary cells of a second group comprising elementary cells mounted on lines of the instruction address bus of the standardized central processing unit, and wherein the step of entering the verification address is performed serially through the second data shift path.

12. The process as claimed in claim 11, wherein the second data shift path furthermore includes elementary cells mounted on access lines of the standardized central processing unit serving to carry signals for selecting modes of execution of the procedure for testing the application program.

13. The process as claimed in claim 11, wherein the step of entering the verification address through the second data shift path is performed during an interrupt of the execution of the application program.

14. An application specific integrated circuit formed on a single silicon chip, comprising:

application-dependent devices which are dependent on the application of the integrated circuit;

a standardized central processing unit having a plurality of input/output gateways that are coupled to the application-dependent devices for interfacing the standardized central processing unit with the application-dependent devices during operation of the application specific integrated circuit, at least one shift register including a set of elementary cells connected in series and each mounted on a respective line carrying a binary signal of the application specific integrated circuit, each cell being able to inject onto its respective line a value entered serially through the at least one shift register and being able to sample the value of the binary signal carried by its respective line with a view to a reading of this value through the at least one shift register; and wherein the elementary cells of the at least one shift register are mounted between the standardized central processing unit and the application-dependent devices on lines corresponding to the input/output gateways of the standardized central processing unit.

15. The application specific integrated circuit as claimed in claim 14, wherein the at least one shift register includes elementary cells mounted on lines of an instruction address bus of the standardized central processing unit in order to store a verification address which can be entered serially through the at least one shift register, wherein the standardized central processing unit comprises a program counter in order to deliver on the instruction address bus addresses of locations of a program memory containing an application program, and wherein the standardized central processing unit furthermore comprises a comparator having an input connected to the program counter and an input connected to the elementary cells mounted on the lines of the instruction address bus, the comparator being arranged to activate a detection signal when the address supplied by the program counter is equal to the verification address.

16. The application specific integrated circuit as claimed in claim 15, wherein the comparator is furthermore arranged to activate an interrupt signal delayed with respect to the detection signal in order to interrupt execution of the application program when it reaches the instruction stored at the verification address in the program memory.

17. The application specific integrated circuit as claimed in claim 15, wherein the at least one shift register includes at least two data shift paths, a first data shift path being formed between elementary cells of a first group comprising elementary cells mounted respectively on lines of a data bus, a data address bus, an instruction bus, the instruction address bus, a command input bus and a command output bus of the standardized central processing unit, a second data shift path being formed between elementary cells of a second group comprising elementary cells mounted on lines of the instruction address bus of the standardized central processing unit.

18. A process for testing the operation of an application specific integrated circuit formed on a single silicon chip, the application specific integrated circuit including a standardized processor and at least one application-dependent circuit, the standardized processor having a plurality of input/output lines for interfacing with the at least one application-dependent circuit, the process including the steps of:

A. forming a serial scan path through at least a portion of the application specific integrated circuit, the serial scan path including a plurality of scan path elements mounted between the standardized processor and the at least one application-dependent circuit, the serial scan path further including a respective scan path element mounted on each of the plurality of input/output lines for interfacing the standardized processor with the at least one application-dependent circuit;

B. executing a test program on the standardized processor in the application specific integrated circuit, the test program generating test results on at least some of the input/output lines of the standardized processor; and C. reading the test results through the serial scan path.

19. The process as claimed in claim 18 wherein step B includes:

entering test data through the serial scan chain, the test data being characteristic of the at least one application-dependent circuit;

storing the test data within the application specific integrated circuit; and executing a test program in the standardized processor that reads the test data, performs a processing operation on at least a portion of the test data, and stores test results of the processing operation.

20. The process as claimed in claim 19, wherein the step of executing the test program includes exchanging data between the standardized processor and the at least one application-dependent circuit.

21. The process as claimed in claim 19 wherein the standardized processor includes an internal memory, and wherein the test data and the test results are stored in the internal memory.

22. The process as claimed in claim 19 wherein the serial scan path includes scan path elements respectively mounted on lines of a data bus and an instruction bus of the standardized processor, wherein the standardized processor includes a memory, and wherein the steps of entering and storing test data include the steps of:

controlling the serial scan path to input test data that is characteristic of the at least one application-dependent circuit onto the data bus;

controlling the serial scan path to input onto the instruction bus an instruction for writing data present on the data bus at a location within the memory; and executing the instruction present on the instruction bus so that the test data is written into the memory.

23. The process as claimed in claim 19, wherein the serial scan path includes scan path elements respectively mounted on lines of a data bus and an instruction bus of the standardized processor, wherein the standardized processor includes a memory, and the step of reading the stored test results includes the steps of:

controlling the serial scan path to input onto the instruction bus an instruction for reading the stored test results from the memory and for sourcing the test results to the data bus;

executing the instruction present on the instruction data bus so that the stored test results are read from the memory and sourced to the data bus; and controlling the serial scan path so that the test results are stored from the data bus and serially read out of the application specific integrated circuit.

24. The process as claimed in claim 18 for testing an application program stored in a program memory within the application specific integrated circuit, wherein steps B and C include the steps of:

D. controlling the serial scan path to input a verification address;

E. storing the verification address within the application specific integrated circuit;

F. executing the application program until the address of the program memory matches the verification address; and G. reading through the serial scan path at least some of the values present on the input/output lines interfacing the standardized processor with the at least one application-dependent circuit.

25. The process as claimed in claim 24, wherein step F includes the step of interrupting the application program when it reaches the instruction stored within the program memory at the verification address.

26. The process as claimed in claim 25 wherein the standardized processor includes a program counter and the application specific integrated circuit includes a comparator, the comparator having one input connected to the program counter of the standardized processor and the other input connected to a subset of the scan path elements, and wherein the storing of the verification address includes the step of storing the verification address within the subset of scan path elements; and wherein step F includes the step of activating a comparator output signal when the address supplied by the program counter is equal to the verification address.

27. The process as claimed in claim 18, wherein the step of forming a serial scan path includes forming first and second serial scan paths, each scan path including a plurality of scan path elements, the first serial scan path including a first group of scan path elements mounted respectively on lines of a data bus, a data address bus, an instruction bus, an instruction address bus, a command input bus and a command output bus of the standardized processor, the second serial scan path including a second group of scan path elements mounted respectively on lines of the instruction address bus of the standardized processor, and wherein the step of entering the verification address is performed serially through the second serial scan path.

28. The process as claimed in claim 27 wherein the step of entering the verification address through the second serial scan path is performed during an interrupt of the execution of the application program.

29. An application specific integrated circuit formed on a single silicon chip, comprising:

a standardized processor;

at least one application-dependent circuit which is dependent on the application of the integrated circuit and which is connected to the standardized processor, the standardized processor having a plurality of input/output lines for interfacing with the at least one application-dependent circuit; and at least one serial shift register including a set of elementary cells connected in series and each mounted on a respective line carrying a binary signal of the application specific integrated circuit, each cell being able to output onto its respective line a value entered serially through the at least one serial shift register, each cell further being able to sample the value of a binary signal carried by its respective line so that binary signals on the lines on which the set of elementary cells is mounted can be read through the at least one serial shift register; and wherein elementary cells of the at least one serial shift register are mounted between the standardized processor and the at least one application-dependent circuit on the input/output lines of the standardized processor that interface with the at least one application-dependent circuit.

30. An application specific integrated circuit as claimed in claim 29, wherein the application specific integrated circuit includes a program memory for storing an application program, wherein the at least one serial shift register includes a group of elementary cells mounted to store a verification address which can be entered serially through the at least one serial shift register, and wherein the application specific integrated circuit further includes:

a program counter in order to deliver on the instruction address bus addresses of the program memory locations including the application program; and a comparator having a first input connected to the program counter and a second input connected to the group of elementary cells storing the verification address, the comparator being arranged to activate a detection signal when the address supplied by the program counter is equal to the verification address.

31. The application specific integrated circuit as claimed in claim 30, wherein the comparator is furthermore arranged to activate an interrupt signal delayed with respect to the detection signal in order to interrupt execution of the application program when it reaches the instruction stored at the verification address in the program memory.

32. The application specific integrated circuit as claimed in claim 31, wherein the at least one serial shift register includes at least two data shift paths, a first data shift path being formed between elementary cells of a first group comprising elementary cells mounted respectively on lines of a data bus, a data address bus, an instruction bus, an instruction address bus, a command input bus and a command output bus of the standardized processor, a second data shift path being formed between elementary cells of a second group comprising elementary cells mounted on lines of the instruction address bus of the standardized processor.

33. A process for testing the operation of an application specific integrated circuit formed on a single silicon chip, the application specific integrated circuit including a processor and a plurality of application-dependent circuits, the application specific integrated circuit having a plurality of internal connection lines for interfacing between the application-dependent circuits and for further interfacing between the processor and the plurality of application-dependent circuits, the process including the steps of:

forming a serial scan path through at least a portion of the application specific integrated circuit, the serial scan path including a plurality of scan path elements, each scan path element being mounted on a respective connection line;

entering test data through the serial scan path, the test data being characteristic of at least one of the plurality of application-dependent circuits;

storing the test data within the application specific integrated circuit;

executing a test program on the processor in the application specific integrated circuit that reads the test data and performs a processing operation on at least a portion of the test data;

storing test results of the processing operation in the application specific integrated circuit; and reading the stored test results from the application specific integrated circuit.

34. A process for testing the operation of an application specific integrated circuit as recited in claim 33 wherein the step of storing the test results includes storing the test results in at least one scan path element, and wherein the step of reading the stored test results includes controlling the serial scan path to serially read the test results out of the integrated circuit.

35. A process for testing the operation of an application specific integrated circuit, the application specific integrated circuit including a processor and a plurality of application-dependent circuits, the application specific integrated circuit having a plurality of internal connection lines for interfacing between the application-dependent circuits and for further interfacing between the processor and the plurality of application-dependent circuits, the application specific integrated circuit further including a program memory for storing an application program for execution by the processor, the process including the steps of:

forming a serial scan path through at least a portion of the application specific integrated circuit, the serial scan path including a plurality of scan path elements, each scan path element being mounted on a respective connection line;

controlling the serial scan chain to input a verification address;

storing the verification address within the application specific integrated circuit;

executing the application program until the address of the program memory equals the verification address; and reading a value present on at least one connection line of the processor out of the application specific integrated circuit.

36. A process for testing the operation of an application specific integrated circuit as recited in claim 35 wherein the step of reading a value present on at least one of the connection lines of the processor includes the steps of:

storing the at least one input/output line value in a scan path element; and controlling the serial scan chain to serially read the value stored in the scan path element out of the application specific integrated circuit.

37. A process for testing the operation of an application specific integrated circuit, the application specific integrated circuit including a processor and a plurality of application-dependent circuits, the application specific integrated circuit having a plurality of internal connection lines for interfacing between the application-dependent circuits and for further interfacing between the processor and the plurality of application-dependent circuits, the application specific integrated circuit further including a program memory for storing an application program for execution by the processor, the process including the steps of:

forming a serial scan path through at least a portion of the application specific integrated circuit, the serial scan path including a plurality of scan path elements, each scan path element being mounted on a respective connection line; determining a program memory failure address at which the application program fails;

starting execution of the application program;

halting execution of the application program at the determined failure address;

entering expected data through the serial scan chain so that the plurality of connection lines interfacing the processor to the plurality of application-dependent circuits include values equaling those that would be expected if the application program were to execute without failure; and re-starting execution of the application program.

38. An application specific integrated circuit formed on a single silicon chip, comprising:

a standardized processor having a plurality of input/output lines;

at least one application-dependent device which is dependent on the application of the integrated circuit and is connected to at least one of the input/output lines of the standardized processor; and a standardized shift register including a set of elementary cells connected in series and each mounted on a respective line carrying a binary signal of the application specific integrated circuit, each cell being able to inject onto its respective line a value entered serially through the standardized shift register and being able to sample the value of the binary signal carried by its respective line so that the value can be read through the standardized shift register;

wherein an elementary cell of the standardized shift register is mounted between the standardized processor and the at least one application-dependent device on each of the at least one input/output line of the standardized processor that is connected to the application-dependent device.

39. An application specific integrated circuit formed on a single silicon chip, comprising:

a standardized device having a plurality of input/output lines;

at least one application-dependent device which is dependent on the application of the integrated circuit and is connected to at least one of the input/output lines of the standardized device; and a shift register including a set of elementary cells connected in series and each mounted on a respective line carrying a binary signal of the application specific integrated circuit, each cell being able to inject onto its respective line a value entered serially through the shift register and being able to sample the value of the binary signal carried by its respective line so that the value can be read through the shift register;

wherein an elementary cell of the shift register is mounted between the standardized device and the at least one application-dependent device on each of the at least one input/output line of the standardized device that is connected to the application-dependent device.

40. The application specific integrated circuit recited in claim 39, wherein the shift register is standardized.

\* \* \* \* \*

UNITED STATES PATENT AND TRADEMARK OFFICE

CERTIFICATE OF CORRECTION

PATENT NO. : 5,515,382

DATED : May 7, 1996

INVENTOR(S): Jean-Louis LABORIE

It is certified that error appears in the above-identified patent and that said Letters Patent is hereby corrected as shown below:

On the title page at [75] Inventor: Jean-Louis Laborie, Saint-Egreve, France at [73] Assignee: SGS-Thomson Microelectronics S.A.
Saint-Genis, Pouilly, France Signed and Sealed this Thirtieth Day of July, 1996

Attest:

BRUCE LEHMAN

*Attesting Officer*     *Commissioner of Patents and Trademarks*